June 1, 1965 J. E. KUNZLER 3,187,229

SUPERCONDUCTING MAGNET UTILIZING SUPERCONDUCTIVE SHIELDING AT LEAD JUNCTIONS

Filed Nov. 1, 1961

INVENTOR.
J. E. KUNZLER

BY George S. Indig

ATTORNEY 3,187,229
Patented June 1, 1965

United States Patent Office 3,187,229

SUPERCONDUCTING MAGNET UTILIZING SUPERCONDUCTIVE SHIELDING AT LEAD JUNCTIONS

John E. Kunzler, Pleasant Grove, N.J., assignor to Bell Telephone Laboratories, Incorporated, New York, N.Y., a corporation of New York Filed Nov. 1, 1961, Ser. No. 149,442
10 Claims. (Cl. 317—123)

Figure 1:
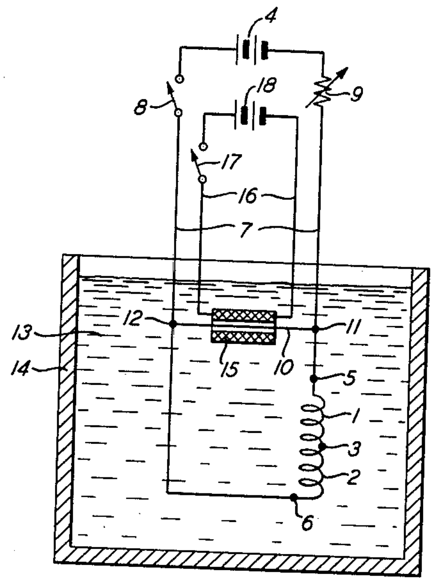

This invention relates to superconducting devices and, in particular, to superconducting devices utilizing superconducting magnetic shielding members.

Typical superconducting devices utilize a superconducting wire member in various configurations. Such configurations may be either single or multiple straight wire strands or, for many uses, may assume the form of one or more coils as in ordinary solenoids. Most contemplated uses of such devices are dependent upon the creation of a magnetic field of some magnitude, necessitating the flow of fairly large currents.

Generally, a plurality of superconducting members are utilized in the electrical circuitry of such devices. For example, the coils of a superconducting solenoid are connected to an external power source by leads which, at least in the vicinity of the coils, are superconducting. Where it is desired to establish a persistent current in the solenoid, the superconducting leads are connected by a superconducting shunt.

It is known that the effectiveness of a given superconducting material in such uses is limited by parameters which have come to be designated as critical current and critical field. These values are defined as the maximum current and field values which can be tolerated by the medium in its superconducting state. Exceeding either maximum results in a breakdown of the material into its normal state and results in a finite resistance. The two quantities are interrelated, the highest value of critical field corresponding with zero critical current and the highest value of critical current corresponding with the lowest value of critical field.

Contact between the superconducting members in the circuitry is made by conventional methods including soldering, fusing, and the like, all of which involve some degree of heating of the junction between the members. As is understood by the art, such heating generally is detrimental to superconducting properties and causes a diminution in critical current values. For example, it is recognized that the cold extrusion and cold drawing processes utilized to form superconducting wires enhance critical current values by introducing an element of strain in the wires. However, a subsequent anneal lowers the critical current value by relieving the strained condition.

Since the same current flows through all members of the superconducting circuit, the maximum tolerable current in the circuit is therefore limited to the lower critical current values at the junctions between the members. Such lower currents undesirably restrict the obtainable field in superconducting solenoids.

In accordance with the instant invention, it has been determined that by means of a particular configuration the critical current values at the junctions between superconducting members can be increased. In particular, the invention relates to a superconducting device utilizing a superconducting magnetic shielding member substantially surrounding the junction between two superconducting members. The shielding member substantially excludes the magnetic field of the device from the vicinity of the junction. Since critical current and critical field values are interrelated, the tolerable critical current values of the junction are therefore increased, with a resulting increase in maximum current flow through the circuitry of the device. The increased current flow results in an increase in the obtainable magnetic field generated by the device.

Figure 2:
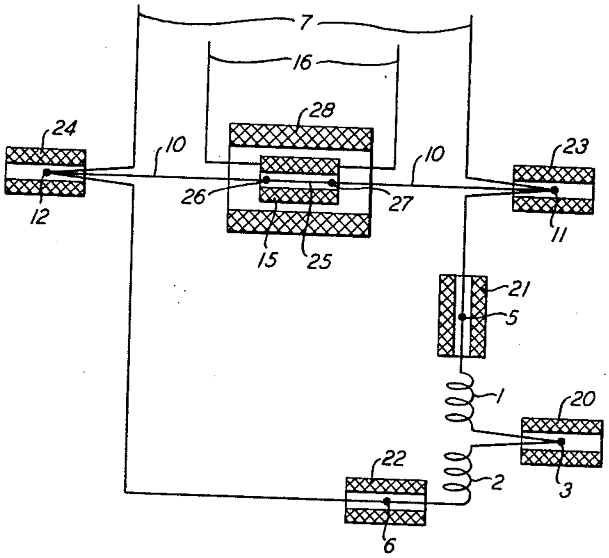

A more complete understanding of the invention may be gained from reference to the drawing, in which:

FIG. 1 is a sectional view including a schematic representation of a superconducting solenoid and is illustrative of the junctions between typical superconducting members utilized in such devices; and FIG. 2 is a front elevational view of a particular section of the solenoid of FIG. 1 including the shunt, the coils, and the associated circuitry and is illustrative of the configuration of the invention wherein superconducting magnetic shielding members are utilized to shield the junctions between the superconducting members from the magnetic field of the solenoid.

Referring again to FIG. 1, there is shown a superconducting solenoid utilizing coils 1 and 2 making contact at junction 3. Coils 1 and 2 are connected to an external power source such as battery 4 by means of connections 5 and 6, leads 7, switch 8, and variable resistor 9. Resistor 9 permits the current from the power source to the coils to be varied. Leads 7 are connected to shunt 10 by means of connections 11 and 12. Coils 1 and 2 and shunt 10 are maintained at a temperature below their critical temperature by suspending them in a low temperature environment 13 such as liquid helium contained in Dewar flask 14. Shunt 10 is encircled by solenoid 15 connected by leads 16 and switch 17 to external power supply 18.

Coils 1 and 2 are formed of a superconducting wire material exhibiting the requisite critical field and critical current characteristics for the intended use. Advantageously superconducting coils are formed of a single strand of a superconducting wire. In many instances, however, the length of wire resulting from the cold extrusion and cold working processes is not sufficient to form the desired coil configuration. In such cases, multiple wire strands are joined together as shown in FIG. 1.

The considerations dictating the choice of material for leads 7 are understood by the art. In general, those portions of leads 7 from shunt 10 to coils 1 and 2 are formed of a suitable superconducting wire material capable of sustaining the same current flow as the coils. Those portions of leads 7 from external power source 4 to shunt 6 are not suspended in the low temperature environment are advantageously formed of a low resistance material such as copper which exhibits a lower resistance than the typical superconducting materials in a normal state.

Persistent currents are established in coils 1 and 2 by one of two methods, both of which utilize a superconducting shunt 10. In accordance with the first method, coils 1 and 2 are initially suspended in the low temperature environment 13. After establishment of a current in the coils by power supply 4, shunt 10 is immersed in the low temperature environment, thereby making it superconducting. Power supply 4 is then disconnected by means of switch 8 with the resulting establishment of a persistent current through the coils, the shunt, and the associated circuitry.

The alternative method permits all of the superconducting circuitry to be initially suspended in the low temperature environment. As depicted in FIG. 1, a portion of shunt 10 is encircled by a solenoid 15 connected to an external power source 18. When activated, solenoid 15 causes the critical field value of the shunt to be exceeded, and the shunt reverts to its normal resistive state. While shunt 10 is in its resistive state, a current is established in coils 1 and 2 by means of power supply 4. Subsequently, shunt solenoid 15 is deactivated by switch 17, causing the shunt to become superconducting. By opening switch 8, power supply 4 is disconnected from the superconducting circuitry with the resulting establishment of a persistent current through the shunt and the coils.

When it is desired to utilize an external power source during operation, so as to permit repeated variation of the magnetic field, shunt 10 is eliminated or desirably formed of a low resistance material. As previously discussed, superconducting materials in their normal state typically exhibit higher resistances to current flow than the conventional low resistance materials. Accordingly, should coils 1 and 2 accidentally revert to their normal state, current from the external power source is automatically diverted through the low resistance shunt and does not pass through the coils. Such diversion minimizes the danger that current flowing through the coils in their normal state will create sufficient heat to injure the coils.

FIG. 2 depicts that section of the solenoid of FIG. 1 consisting of shunt 10, coils 1 and 2, and the associated circuitry, including connections 3, 5, 6, 11, and 12 and leads 7. In accordance with this embodiment of the invention, connections 3, 5, 6, 11, and 12 are shielded from the magnetic field generated by coils 1 and 2 by superconducting magnetic shielding members 20, 21, 22, 23, and 24, respectively. For this embodiment, the shielding members are formed of a wound coil having a plurality of turns encircling the designated connection. Although not shown in the figure, each member is electrically closed by connecting the ends of each coil inside the coil turns, thereby shielding the connection from the external field.

FIG. 2 further illustrates a particular embodiment of the shunt configuration of FIG. 1. The embodiment is predicated on the desirability of being able to switch shunt 10 from a superconducting to a resistive state by a small magnetic field, thereby minimizing the power requirements of solenoid 15. This consideration dictates use of a low critical field material having critical current characteristics commensurate with those of the other current-carrying components of the superconducting circuitry. Accordingly, a portion of shunt 10, namely segment 25, is formed of a low critical field material connected to the remaining portions of shunt 10 by connections 26 and 27. The critical field value is sufficiently low so that ordinarily the magnetic field associated with coils 1 and 2 precludes segment 25 from being superconducting, even when solenoid 15 is deactivated. Superconducting magnetic shielding member 28 is therefore utilized to shield segment 25 and connections 26 and 27 from the external field. In this fashion, the particular superconducting or resistive state of segment 25 is determined solely by means of solenoid 15.

Shunt segment 25 and connections 26 and 27 may be eliminated from that embodiment of FIG. 2 by forming the complete length of shunt 10 of the low critical field material utilized for segment 25. For this configuration, shielding member 28 is extended so as to encircle all of the shunt, including junctions 11 and 12 between shunt 10 and lead wires 7. In this manner the necessity for separate superconducting shielding members 23 and 24 is eliminated. In similar fashion, the superconducting circuitry shown in FIG. 2 may be rearranged so that all junctions between the superconducting members are shielded from the magnetic field of coils 1 and 2 by only one superconducting shielding member rather than the multiplicity of shielding members shown in FIG. 2.

The superconducting magnetic shielding members of the invention are formed of one or more electrically closed turns of a superconducting material encircling that portion of the superconducting circuitry of the device to be shielded. The magnetic shielding action of these members is based on the recognized principle that when a superconducting material is placed in a superconducting state by cooling to or below its critical temperature, the material then acts as a magnetic insulator and repels an external magnetic field acting on it. The external magnetic field strength capable of being repelled by the shielding member is equal to the field strength capable of being generated by the member. The parameters determining the field strength generated by shaped superconducting materials are well detailed in the art. As such, the particular configuration and material to be utilized as a specific shielding member of the invention is within the knowledge of the art.

Commensurate with this knowledge, the magnetic field strength in the vicinity of the circuitry to be shielded is readily determinable, for example by a conventional magnetic field probe. The critical field and critical current characteristics of the superconducting materials are well documented in the literature and readily determinable by now conventional methods. The advantages of a single turn configuration forming, for example, a hollow cylinder encircling a superconducting connection or a multiple turn configuration forming a coil encircling the connection are also understood by the art. For example, the choice of a particular configuration is recognized to depend at least in part on the mechanical and superconducting properties of the material utilized. Certain materials are not readily fabricated into a single turn configuration. Also, the superconducting properties of many materials are enhanced by the cold-working steps incumbent in the shaping of the material into a wire strand. In such instances, the use of a coil configuration is preferred.

Copending U.S. application Serial No. 56,748, filed September 19, 1960, by J. E. Kunzler, now Patent No. 3,129,359, granted April 9, 1964, teaches a method of increasing the obtainable field strength of a superconducting coil by connecting some or all of the windings in parallel rather than in series. For the same considerations discussed therein, a parallel wound coil requires fewer windings than a series wound coil to shield a superconducting connection from a given external field. Accordingly, the use of both parallel and series wound coils is intended to be within the scope of the invention.

One advantage accruing from the use of the shielding members of the invention is the permissible utilization of superconducting solders to make connections in a superconducting circuit. In general, the use of such solders is avoided due to their low critical field value and low critical current characteristic in a magnetic field. The use of certain superconducting materials in the circuitry, however, makes it desirable to be able to make solder connections to such materials. Illustrative of such materials is $Nb_3Sn$, filed on January 9, 1961. It has been determined that mechanically fusing lengths of $Nb_3Sn$ wire to each other or to other wires in the circuitry results in a diminution in critical current at the connection to a value only $\frac{1}{50}$ that tolerable by the remaining length of wire.

For reasons previously described, the shielding members of the invention, by substantially excluding the magnetic field associated with the device from the vicinity of the connection, permit the tolerable critical current values of superconducting solders to be increased to values approximating those of the superconducting current-carrying elements in the circuit. For example, it has been determined that lead-tin solder, when shielded by a shielding member of the invention, exhibits a critical current value approximating that of $Nb_3Sn$ in a high field. Since the interdependency of critical current and critical field characteristics of a given superconducting solder is within the knowledge of the art, the particular solder most advantageous for making a superconducting connection is readily determinable.

Of necessity, the invention is described in a limited number of embodiments. Alternative embodiments readily apparent to those skilled in the art are intended to be within the scope of the appended claims.

What is claimed is:

1. A superconducting device comprising two superconducting members suspended in a low temperature environment and a contact between said members, said contact being magnetically shielded by an electrically closed superconducting magnetic shielding member, and in which at least one of the said superconducting members consists essentially of a plurality of convolutions about a substantially common axis.

2. A device in accordance with claim 1 wherein said contact is a solder contact.

3. A device in accordance with claim 1 wherein said shielding member is formed of at least one turn of a superconducting material encircling said contact.

4. A device in accordance with claim 2 wherein said shielding member has a cylindrical configuration.

5. A device in accordance with claim 2 wherein said shielding member has a plurality of turns forming a coil encircling said contact.

6. A superconducting device comprising a superconducting wire member consisting essentially of a plurality of convolutions about a substantially common axis for generating a magnetic field, leads contacting said wire member at contact points and connecting said member with an external power source, and a superconducting shunt contacting and connecting said leads at contact joints, said leads being superconducting at least in the portion of said leads between the shunt and the wire member, together with means for reducing the temperature of said superconducting members to a temperature below their critical temperature, said contact points being magnetically shielded from the magnetic field by at least one electrically closed superconducting magnetic shielding member.

7. A device in accordance with claim 6 wherein a solenoid encircles a length of said shunt and an electrically closed superconducting magnetic shielding member encircles said solenoid.

8. A device in accordance with claim 6 wherein said shielding member is formed of at least one turn of a superconducting material.

9. A device in accordance with claim 8 wherein said shielding member has a cylindrical configuration.

10. A device in accordance with claim 8 wherein said shielding member has a plurality of turns forming a coil.

References Cited by the Examiner

UNITED STATES PATENTS

| | | | |
|---|---|---|---|
| 2,913,881 | 11/59 | Garwin | 307—88.5 |
| 2,914,735 | 11/59 | Young | 307—88.5 |
| 3,015,960 | 1/62 | Steele | 317—158 |

SAMUEL BERNSTEIN, *Primary Examiner.*